United States Patent [19]

Prentice

[11] Patent Number: 4,979,011

[45] Date of Patent: Dec. 18, 1990

[54] SCR STRUCTURE FOR FAST TURN-ON SWITCHING

[75] Inventor: John S. Prentice, Palm Bay, Fla.

[73] Assignee: Harris Corporation, Melbourne, Fla.

[21] Appl. No.: 451,249

[22] Filed: Dec. 15, 1989

[51] Int. Cl.$^5$ ............................................. H01L 29/74
[52] U.S. Cl. ........................................ 357/38; 357/44; 357/39; 357/46
[58] Field of Search ................... 357/38, 38 L, 44, 39, 357/46

[56] References Cited

U.S. PATENT DOCUMENTS

| | | | |
|---|---|---|---|
| 4,635,087 | 1/1987 | Birrittella et al. | 357/38 |
| 4,677,455 | 6/1987 | Okajima | 357/38 |

Primary Examiner—Andrew J. James
Assistant Examiner—Courtney A. Bowers
Attorney, Agent, or Firm—Barnes & Thornburg

[57] ABSTRACT

A latching switch having a vertical and lateral PNP connected in parallel with each other and having their bases connected to the collectors of parallel connected vertical and lateral NPN transistors and having their collectors connected to the bases of the NPN transistors. The PNP emitters form the anode, the PNP bases form the anode gate, the NPN bases form the cathode gate and the NPN emitters form the cathode of the latching switch. The integration in a planar process is achieved by having N and P wells contiguous at a first boundary and providing the appropriate base and emitter regions in the appropriate well to produce the interconnected vertical NPN and PNP transistors. Some embodiments minimize and virtually eliminate the lateral transistors while maintaining integrated connection.

16 Claims, 3 Drawing Sheets

SCR STRUCTURE FOR FAST TURN-ON SWITCHING

BACKGROUND OF THE INVENTION

The present invention relates generally to latching switches and more specifically to an improved fast turn-on latching switch.

Latching switches generally known as silicon controlled rectifier (SCR) is a four layer PNPN thyristor. The structure includes a P anode, an N anode gate, a P cathode gate and an N cathode. This SCR structure has advantages over most other solid state switches in its ability to pass a large current per unit area. For this reason SCR's are used in power driver circuits, which convert a logic level signal into a gate drive for power MOS's. For fast circuit operation, the turn-on time of the SCR should be minimized.

An SCR structure of the prior art which is compatible with the present integrated circuit processing techniques is illustrated in FIG. 1. An N− island 10 having a buried N+ layer 12 is dielectrically isolated from a support structure 14 by a dielectric isolation layer 16. An N+ cathode region 18 is formed in a P−cathode gate region 20 which also includes and P+ cathode gate contact region 22. The P+ anode 24 is formed in the N−anode gate region 10 as is an N+ anode gate contact region 28.

As illustrated in FIG. 2, the schematic of the SCR of FIG. 1 includes a vertical NPN transistor QV1 connected with a lateral PNP transistor QL2. The anode region 24 forms the emitter of transistor QL2, the anode gate or substrate 10 forms the base of QL2 and the cathode gate region 20 forms the collector of QL2. The cathode 18 forms the emitter of the vertical transistor QV1, cathode gate 20 forms the base of QV1 and the anode gate or substrate 10 forms the collector of QV1. The common uses of the anode gate or substrate 10 and cathode gate 20 forms the interconnection of the collector of QL2 to the base of QV1 and the collector of QV1 to the base of QL2. This interconnection forms a positive feedback loop. To turn the switch on, current is applied to either of the transistor bases. The SCR is not fully turned on until the signal propagates completely around the feedback loop illustrated in dash lines of FIG. 2.

For sake of clarity, the regions in the integrated circuit will be referred to using their transistor names instead of their SCR names and it is understood that they represent their respective SCR functions.

If for example, the turn-on signal is applied to the base of QV1 at region 22, there is a delay until the signal appears at the collector 10 of QV1. This time delay is the time it takes electrons being injected from the cathode or emitter 18 and diffusing through the base region 20 into the collector 10. This electron current then forward biases the emitter 24 base 10 junction of QL2 causing holes to be injected into the base region 10. These holes are then diffused through the base region 10 to be collected by the collector 20 of the lateral transistor QL2 which is also the base of QV1, which is a starting point. This ends the feedback loop. The turn-on time is proportional to the sum of both of the delays of the vertical Q1 and the lateral Q2.

It is known that for a fixed value Vbe, the base stored charge is proportional to base width and the collector current. Therefore, beta is inversely proportional to base width. This makes the base transient time inversely proportional to the base width squared. For a lateral transistor to vertical base width ratio in the order of 10, the difference between the lateral and vertical electrical parameters are significant. As illustrated in FIG. 1, the vertical base width WV1 is essentially small compared to the lateral base width WL2.

A solution to this problem is to form both the NPN and the PNP transistors as vertical device, thereby minimizing the base width and turn-on time. The merging of vertical PNP and NPN transistors has not been possible in planar processes to date.

Thus it is an object of the present invention to provide an integrated circuit having a vertical NPN and a vertical PNP integrated together to form a latching switch.

Another object of the present inventions is to improve the turn-on time of an SCR built in an integrated circuit.

Still another object of the present invention is to maximize the anode and cathode gate junction of an SCR per unit volume.

These and other objects are achieved by forming the latching switch having a vertical and lateral PNP connected in parallel with each other and having their bases connected to the collectors of parallel connected vertical and lateral NPN transistors and having their collectors connected to the bases of the NPN transistors. The PNP emitters form the anode, the PNP bases form the anode gate, the NPN bases form the cathode gate and the NPN emitters form the cathode of the latching switch. The vertical and lateral PNP's have a common base emitter junction and the vertical and lateral NPN's have a common base emitter junction The vertical and lateral PNP's have a common base region which has a junction with a collector region of the vertical PNP and a boundary with a collector region of the vertical NPN. The vertical and lateral NPN's have a common base region which has a junction with the collector region of the vertical NPN and a boundary with the collector region of the vertical PNP.

The integration in a planar process is achieved by having N and P wells contiguous at a first boundary and providing the appropriate base and emitter regions in the appropriate well to produce the vertical NPN and PNP transistors. The N anode gate region which forms the base of the vertical PNP is formed in the P well which forms the vertical collector and intersects the well boundary. The anode or P emitter region is formed in the base region. The P base region of the PNP vertical transistor is formed in the N well region and intersects the well boundary and has an N emitter region formed therein. The N base and P base region intersect the well boundary at distinct areas. Preferably the P emitter, N base, N emitter, and P base extend across the boundary into both P and N wells. This provides the four parallel, SCR connected transistors having equal base emitter junctions and having common base emitter junctions.

Other objects, advantages and novel features of the present invention will become apparent from the following detailed description of the invention when considered in conjunction with the accompanying drawings.

BRIEF DESCRIPTION OF THE DRAWINGS

FIG. 2 is a schematic of the SCR of FIG. 1 during turn-on;

FIG. 4 is the electrical schematic of the device of FIG. 3 during turn-on.

DETAILED DESCRIPTION OF THE DRAWINGS

Figure 1:
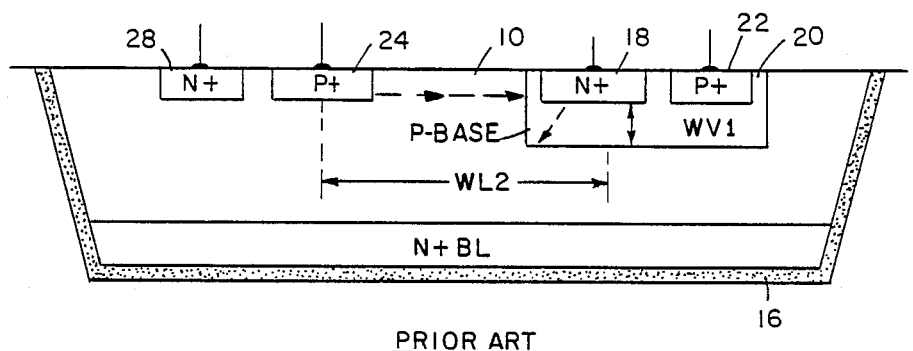
FIG. 1 is a cross-sectional perspective view of an SCR of the prior art.
Figure 3:
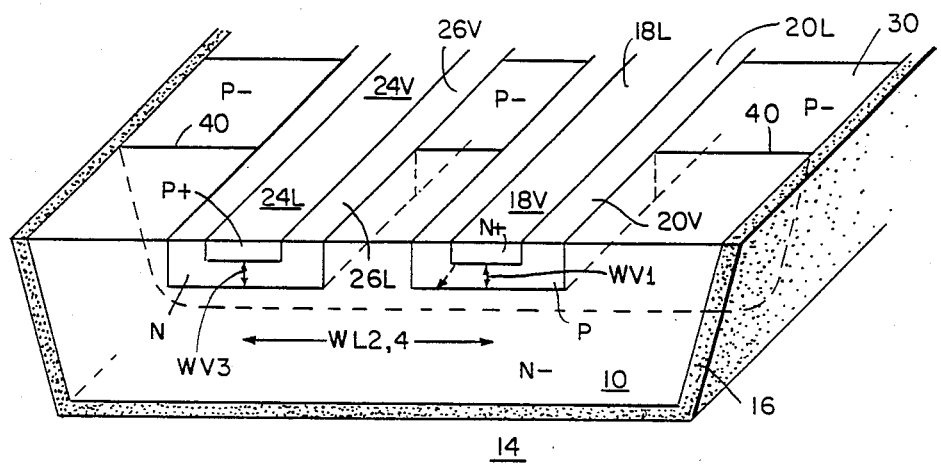
FIG. 3 is a cross-sectional perspective view of a latching switch incorporating the principles of the present invention.
Figure 4:
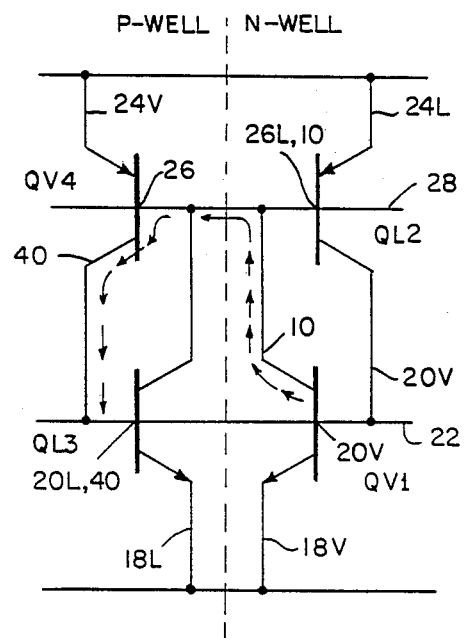

The integrated circuit of FIG. 3 incorporating the present invention uses the same reference numbers as the prior art device of FIG. 1 for those areas which are common. The anode gate contact region 28 and the cathode gate contact region 22 have been deleted from FIG. 3 for sake of clarity and would be included in the produced device. Referring first to FIG. 4, the present invention forms a latching switch or SCR including four transistors. A pair of PNP transistors, one being a vertical transistor QV4 and the other being a lateral transistor QL2 are connected in parallel at their emitters, bases and collectors respectively. Two NPN transistors, one being vertical QV1 and one being lateral QL3, are also connected in parallel at their collectors, bases and emitters respectively. The bases of the PNP transistors QL2 and QV4 are connected to the collectors of the NPN transistors QL3 and QV1. The bases of the NPN transistors QL3 and QV1 are connected to the collectors of the PNP transistors QV4 and QL2.

Figure 2:
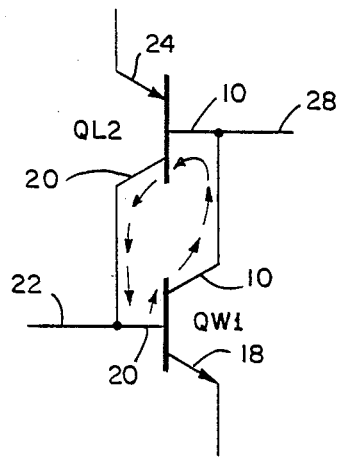

Instead of the feedback being through a fast, vertical transistor QV1 and a slow lateral transistor QL2 as in FIG. 2, the circuit of FIG. 4 provides a fast turn-on path through the vertical transistors QV1 and QV4 as indicated by the dotted lines. Assuming a signal is provided to the base of QV1, it travels from the base to the collector of QV1 and from the base of QV4 to the collector of QV4. Since both these times are relatively short, the total turn-on time is the sum of these two vertical transistors.

The specific integrated circuit configuration is illustrated in FIG. 3. The N well region has a boundary 40 with a P well region 30. In general process sequence, selective introduction of P— impurities into an N— substrate will produce the P— well 30. The P cathode gate region 20 is shown as extending across the boundary 40 into both the N— well 10 and the P— well 30 as does the N+ cathode region 18. The P+ anode 24 also extends across both the N— well region 10 and the P— well region 30. An additional anode gate region 26 is added in which the P+ anode is built and isolated from the P well 30 and it also extends across the boundary 40 into each of the N— well region 10 and the P— well region 30.

The N+ region 18 and P+ region 24 which form the emitters of the respective NPN and PNP transistors are shown with two letters representing the portion of the emitters which are associated with a vertical transistor, using the letter V, and a lateral transistor, using the letter L. Similarly, the P region 20 and N region 26 which form the bases of the bipolar transistors also include the letters V and L. The N— well region 10 forms a collector for the vertical NPN transistor and part of the base for the lateral PNP transistor. The P— well region 30 forms the collector for the PNP vertical transistor and part of the base for the NPN lateral transistor. The notation just described with respect to FIG. 3 is also used in FIG. 4. It should also be noted in FIG. 4 that a vertical dotted line is shown representing the P— well 30 on the left side and the N— well 10 on the right side of the schematic.

With a signal applied to the base 20, the electron current will flow from the N+ emitter 18 V through the P base 20V into the N— collector region 10 as a vertical transistor. Since the N— collector 10 is connected by N region 26L to the N base region 26V of the PNP vertical transistor the charge flow from the P+ emitter 24V to the P— collector 30 is also through a vertical transistor. Since the P— collector 30 is connected to the P base region 20L which is common to the base region 20 V the full circle feedback is completed all through vertical transistors.

You will note that in FIG. 3, that the base emitter junctions of the vertical and lateral NPN and the vertical and lateral PNP are common. Thus they have the same Vbe and the same minority carrier densities at the junction edges. Assuming a ratio of lateral base width to vertical base width of 10 and equal areas of P well and N well, 91% of the current at start up will flow through the vertical transistors QV1 and QV4. This increases the current density and base charge density in the vertical devices by 82%. An increase in Vbe accompanies the increase in current density which also increases the base current. Because of the base width difference, the lateral device current density and base charge density are only 18% of their values if the parallel vertical structures QL2 and QL3 was absent The composite switch including vertical and lateral in parallel, has about half the beta and Ft of the vertical transistor but five times greater beta and fifty times greater Ft than the lateral transistor. A computer simulation of the propagation delay, between the collector current of the PNP due to a base current applied to the NPN, shows that the new structure is twice as fast, as measured to the point where the output equals the input.

By using the P— well 30 in combination with the N— well 10 a junction area is added to the gate to gate junction but does not increase the device volume. At latter stages of turn-on when this gate to gate junction is forward biased, there is less distance or volume per junction area for minority carriers to travel to completely conductivity modulate the device volume.

The separation of the base region 20 and 26 in the embodiment of FIG. 3 is dictated by the required breakdown of voltages of the device and the ground rules. Although FIG. 3 shows a pair of base regions 20 and 26, a plurality of pair of parallel base regions may be added and connected in parallel by electrical conductors on the surface.

Figure 5:
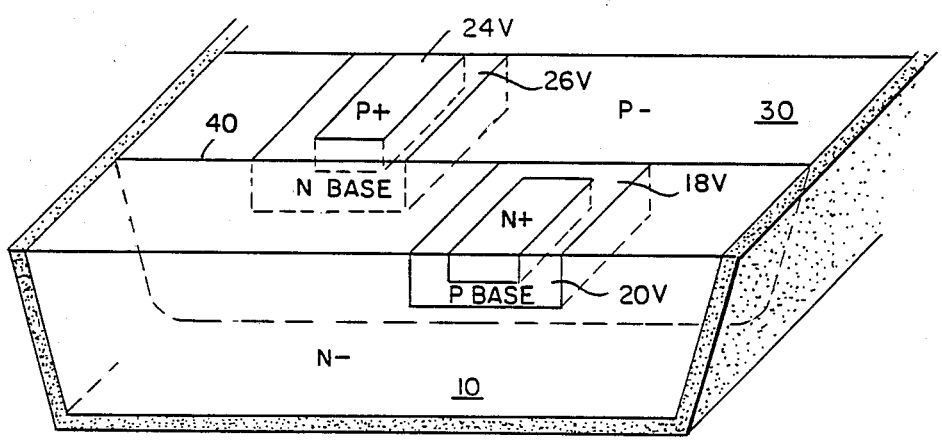
FIG. 5 is a cross-sectional perspective view of another latching switch incorporating the principles of the present invention.

A modification to the circuit in FIG. 3 is illustrated in FIG. 5. The vertical base region 20 V does not extend past the boundary 40. In such an instance, the emitter 18V stops short of the boundary 40 so as to be isolated from the collector 10 as well as the P— well 30. Similarly, the base region 26 lies only in the P— well region 30 and extend to and intersect the boundary 40 without extending past into the N— well region 10. Also the emitter region 24 does not extend to the boundary and lies so as to be isolated from the P— collector 30 and the N— well region 10. The bases of the lateral transistors have become sufficiently large as to be non-operable with respect to the vertical transistors.

Because of masking tolerances, the base 20 and 26 would and should extend a minimum distance beyond the boundary 40 to assure that they intersect the boundary 40. If they do not intersect the boundary 40, the structure becomes two junction isolated complementary transistors. With this structure, the distance between the base regions 20 and 26 may be decreased but should always intersect the boundary 40 at distinct areas.

With respect to FIG. 5 this embodiment does not provide as large of an anode and cathode gate to gate junction as in FIG. 3.

Figure 6:
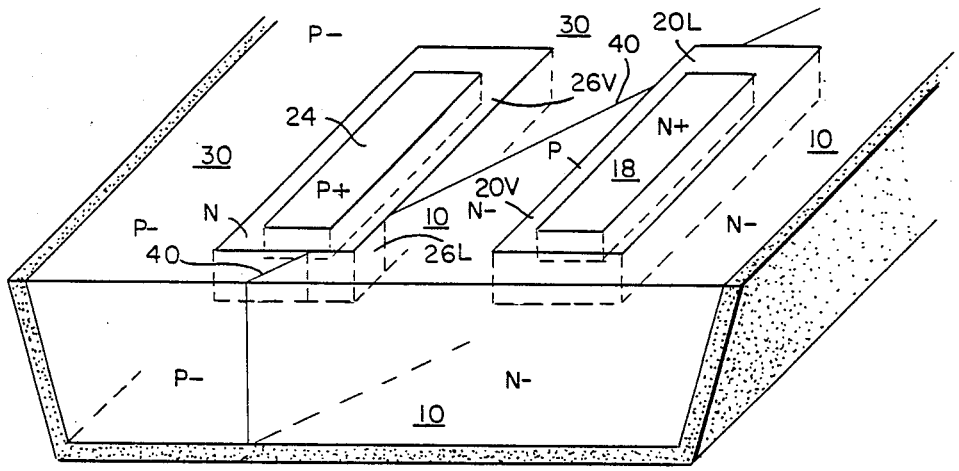
FIG. 6 is a cross-sectional prospective view of even a further latching switch incorporating the principles of the present invention.

A combination of the embodiments of FIGS. 3 and 5 having a reduced lateral transistor structure and increased anode and cathode gate to gate junction is illustrated in FIG. 6. The base regions 20 and 26 are of equal dimensions and are parallel to each other to define a large anode and cathode gate to gate junction. The anode and cathode 24 and 18 have a length less then than their base so as to be isolated from the wells 10 and 30. The wells 10 and 30 and their boundary have been modified wherein boundary 40 is at a diagonal across the well and bases 20, 26. The produced minimum surfaces for the lateral base regions 26L and 20L. As in FIG. 5, the bases 20 and 26 must extend a minimum distance beyond the boundary to assure connection to the opposite well.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. A latching switch, having an anode, anode gate, cathode gate and cathode, comprising:
    a vertical PNP transistor connected in parallel to a lateral PNP transistor by their collectors, bases and emitters;
    a vertical NPN transistor connected in parallel to a lateral NPN transistor by their collectors, bases and emitters;
    said vertical PNP having its collector and base connected respectively to said base and collector of said lateral NPN;
    said lateral PNP having its collector and base connected respectively to said base and collector of said vertical NPN; and
    said PNP's emitter being said anode, said PNP's'base being a said anode gate, said NPN's'base being said cathode gate and said NPN's'emitter being said cathode.

2. A latching switch according to claim 1, wherein said vertical and lateral PNP's have a common base-emitter junction and said vertical and lateral NPN's have a common base-emitter junction.

3. A latching switch according to claim 2, wherein said vertical and lateral PNP's have a common base region which has a junction with a collector region of said vertical PNP and a boundary with a collector region of said vertical NPN; and
    said vertical and lateral NPN's have a common base region which has a junction with said collector region of said vertical NPN and a boundary with said collector region of said vertical PNP.

4. A latching switch according to claim 1, wherein said vertical and lateral PNP's have a common base region which has a junction with a collector region of said vertical PNP and a boundary with a collector region of said vertical NPN; and
    said vertical and lateral NPN's have a common base region which has a junction with said collector region of said vertical NPN and a boundary with said collector region of said vertical PNP.

5. A latching switch, having an anode region, an anode gate region, a cathode gate region and a cathode region integrated in a substrate, comprising:
    N and P wells contiguous at a first boundary;
    N anode gate region in said N and P wells and extending across said first boundary;
    P anode region in said anode gate region;
    P cathode gate region in said N and P wells and extending across said first boundary; and
    N cathode region in said cathode gate region.

6. A latching switch according to claim 5 wherein:
    said anode and anode gate regions form an emitter and base respectively of both a lateral and vertical PNP transistors, said P well forms a collector of said vertical PNP, and said P cathode gate forms a collector of said lateral PNP; and
    said cathode and cathode gate regions form an emitter and base respectively of both a lateral and vertical NPN transistors, said N well forms a collector of said vertical NPN, and said N anode gate forms a collector of said lateral NPN.

7. A latching switch according to claim 5 wherein said N anode gate region and said P cathode gate region extend substantially across said first boundary in both directions.

8. A latching switch according to claim 7 wherein said P anode region and said N cathode region extend substantially across said first boundary in both directions.

9. A latching switch according to claim 5 wherein said first boundary is on a diagonal with respect to the boundaries of the anode gate and cathode gate regions to said wells.

10. A latching switch according to claim 5 wherein said first boundary is transverse to the boundaries of the anode gate and cathode gate regions to said wells.

11. A latching switch, having an anode region, an anode gate region, a cathode gate region, and cathode region integrated in a substrate, comprising:
    N and P well regions contiguous at a first boundary;
    N anode gate region in said P well region and intersecting said first boundary at a first area;
    P anode region in said anode gate region;
    P cathode gate region in said N well region and intersecting said first boundary at a second area distinct from said first area; and
    N cathode region in said cathode gate region.

12. A latching switch according to claim 11 wherein:
    said anode and anode gate regions form an emitter and base respectively of both a lateral and vertical PNP transistors, said P well region forms a collector of said vertical PNP, and said P cathode gate forms a collector of said lateral PNP; and
    said cathode and cathode gate regions form an emitter and base respectively of both a lateral and vertical NPN transistors, said N well region forms a collector of said vertical NPN, and said N cathode gate forms a collector of said lateral NPN.

13. A latching switch, having an anode region, an anode gate region, a cathode gate region and a cathode region integrated in a substrate, comprising:
- a vertical PNP transistor having an N base region formed in a P collector well in said substrate and a P emitter region formed in said N base region;
- a vertical NPN transistor having a P base region formed in an N collector well in said substrate and an N emitter region formed in said P base region;
- N-type means in said substrate for connecting said N base region to said N collector well;
- P-type means in said substrate for connecting said P base region to said P collector well; and
- said P emitter region being said anode, said N base region being said anode gate, said P base region being said cathode gate and said N emitter region being said cathode.

14. A latching switch according to claim 13, wherein
- said N-type means includes said N collector well which has a boundary common with said N base region; and
- said P-type means includes said P collector well which has a boundary common with said P base region.

15. A latching switch according to claim 14, wherein said N base region extends into said N collector well and said P base region extends into said P collector well.

16. A latching switch according to claim 15, wherein said P emitter region extends in said N base region over said N collector well and said N emitter region extends in said P base region over said P collector well.

* * * * *